US010126387B2

(12) United States Patent
Pirkl (10) Patent No.: US 10,126,387 B2
(45) Date of Patent: Nov. 13, 2018

(54) MAGNETIC RESONANCE APPARATUS

(71) Applicant: Siemens Aktiengesellschaft, Munich (DE)

(72) Inventor: Georg Pirkl, Dormitz (DE)

(73) Assignee: Siemens Aktiengesellschaft, Munich (DE)

( * ) Notice: Subject to any disclaimer, the term of this patent is extended or adjusted under 35 U.S.C. 154(b) by 539 days.

(21) Appl. No.: 14/736,757

(22) Filed: Jun. 11, 2015

(65) Prior Publication Data

US 2015/0362572 A1    Dec. 17, 2015

(30) Foreign Application Priority Data

Jun. 11, 2014   (DE) ........................ 10 2014 211 137

(51) Int. Cl.
*G01V 3/00*     (2006.01)
*G01R 33/385*   (2006.01)
*G01R 33/36*    (2006.01)

(52) U.S. Cl.
CPC ...... *G01R 33/3852* (2013.01); *G01R 33/3621* (2013.01)

(58) Field of Classification Search
CPC  G01R 33/20; G01R 33/3852; G01R 33/3621; G01R 33/4816; G01R 33/561;
(Continued)

(56) References Cited

U.S. PATENT DOCUMENTS

| 4,375,676 A | * | 3/1983 | Berkowitz | ............. | G01R 33/28 |
| | | | | | 711/109 |
| 4,727,326 A | * | 2/1988 | Kaplan | .................. | G01R 33/56 |
| | | | | | 324/309 |

(Continued)

FOREIGN PATENT DOCUMENTS

| CN | 205083479 U | * | 3/2016 | ......... | G01R 33/3852 |
| DE | 19911988 A1 | * | 9/2000 | ............. | G01R 33/54 |

(Continued)

OTHER PUBLICATIONS

Yu, Jason. Dual-Clock Asynchronous FIFO in SystemVerilog, www.verilogpro.com/asynchronous-fifo-design/. Jan. 2016.*

*Primary Examiner* — Patrick Assouad
*Assistant Examiner* — Sean Curtis
(74) *Attorney, Agent, or Firm* — Schiff Hardin LLP (57) ABSTRACT

A magnetic resonance apparatus has a computer designed to emit, on each of at least one control channel, a control signal generated from a sequence of values to control, via each channel, at least one component of the magnetic resonance apparatus. A buffer device is provided for each channel, which includes at least one read control device and a control buffer memory for that control channel. A software tool running on the computer is designed to determine the values as a function of predefined parameters and write them to the control buffer memory. The read control device is designed to read values from the control buffer memory and to supply them, with a read clock derived from a clock that was set independently of the computer, to the respective component. For each of the control buffer memories, the order in which the values are read corresponds to the order in which they are written.

19 Claims, 2 Drawing Sheets

(58) Field of Classification Search
CPC .. G01N 24/00; G01N 29/036; G01N 29/0618; G01N 2201/123; G01N 2201/1222; G01N 2203/0688; G01N 2223/421
USPC .................................................. 324/300–322
See application file for complete search history.

(56) References Cited

U.S. PATENT DOCUMENTS

| | | | | |
|---|---|---|---|---|
| 4,885,538 A * | 12/1989 | Hoenniger, III | G01R 33/54 | 324/309 |
| 4,928,063 A * | 5/1990 | Lampman | G01R 33/3852 | 324/307 |
| 5,119,026 A * | 6/1992 | Iino | G01R 33/56 | 324/309 |
| 5,144,242 A * | 9/1992 | Zeilenga | G01R 33/54 | 324/312 |
| 5,349,296 A * | 9/1994 | Cikotte | G01R 33/54 | 324/309 |
| 5,465,361 A * | 11/1995 | Hoenninger | G06F 8/54 | 324/309 |
| 5,514,962 A * | 5/1996 | Cline | G01R 33/54 | 324/307 |
| 5,581,183 A * | 12/1996 | Lindstedt | G01R 33/54 | 324/309 |
| 5,714,884 A * | 2/1998 | Hoshino | G01R 33/54 | 324/307 |
| 5,742,060 A * | 4/1998 | Ashburn | G01T 1/161 | 250/363.09 |
| 6,400,157 B1 * | 6/2002 | Bonanni | G01R 33/54 | 324/309 |
| 6,470,071 B1 * | 10/2002 | Baertsch | A61B 6/4233 | 348/E5.086 |
| 6,504,895 B1 * | 1/2003 | Dixon | A61B 6/00 | 348/E5.086 |
| 6,624,777 B2 * | 9/2003 | Miyano | G06F 5/06 | 324/322 |
| 6,633,162 B2 * | 10/2003 | Zhang | G01R 33/3621 | 324/309 |
| 6,975,752 B2 * | 12/2005 | Dixon | A61B 6/4233 | 250/370.09 |
| 6,989,673 B2 * | 1/2006 | Zhu | G01R 33/3415 | 324/318 |
| 7,053,614 B2 * | 5/2006 | Hornung | G01R 33/54 | 324/300 |
| 7,116,812 B2 * | 10/2006 | Langan | A61B 6/4233 | 382/132 |
| 7,120,282 B2 * | 10/2006 | Langan | H04N 5/32 | 382/128 |
| 7,230,986 B2 * | 6/2007 | Wise | G06F 9/3867 | 375/240.26 |
| 7,276,906 B2 * | 10/2007 | Shvartsman | G01R 33/385 | 324/318 |
| 7,477,057 B2 * | 1/2009 | Baumgartl | G01R 33/36 | 324/318 |
| 7,668,585 B2 * | 2/2010 | Green | A61B 5/113 | 378/8 |
| 7,750,635 B2 * | 7/2010 | Van Helvoort | G01R 33/3415 | 324/318 |
| 7,807,474 B2 * | 10/2010 | Jesmanowicz | G01R 33/3621 | 324/307 |
| 8,021,892 B2 * | 9/2011 | Jesmanowicz | G01R 33/3621 | 324/322 |
| 8,049,505 B2 * | 11/2011 | Van Liere | H03H 17/0642 | 324/318 |
| 8,228,064 B2 * | 7/2012 | Schaefer | G01R 33/3852 | 324/309 |
| 8,736,268 B2 * | 5/2014 | Schaefer | G01R 33/385 | 324/307 |
| 2002/0167434 A1 * | 11/2002 | Miyano | G06F 5/06 | 341/155 |
| 2002/0176535 A1 * | 11/2002 | Dixon | A61B 6/00 | 378/62 |
| 2004/0146189 A1 * | 7/2004 | Langan | H04N 5/32 | 382/128 |
| 2004/0146192 A1 * | 7/2004 | Langan | A61B 6/4233 | 382/132 |
| 2005/0225325 A1 * | 10/2005 | Hornung | G01R 33/54 | 324/318 |
| 2006/0170422 A1 * | 8/2006 | Hornung | G01R 33/54 | 324/318 |
| 2007/0167737 A1 * | 7/2007 | Frank | A61B 5/055 | 600/411 |
| 2009/0251141 A1 * | 10/2009 | Baumgartl | G01R 33/36 | 324/307 |
| 2010/0001725 A1 * | 1/2010 | Van Liere | G01R 33/3621 | 324/307 |
| 2010/0001727 A1 * | 1/2010 | Frydman | G01R 33/4822 | 324/310 |
| 2011/0040997 A1 * | 2/2011 | Baumgartl | G01R 33/543 | 713/401 |
| 2011/0074413 A1 * | 3/2011 | Venkatesa | G01R 33/3852 | 324/309 |
| 2011/0109310 A1 * | 5/2011 | Hornung | G01R 33/3621 | 324/309 |
| 2011/0124301 A1 * | 5/2011 | Prasidh | G01R 33/3692 | 455/110 |
| 2013/0119982 A1 * | 5/2013 | Pirkl | G01R 33/3621 | 324/309 |
| 2013/0181713 A1 * | 7/2013 | Eberlein | G01R 33/385 | 324/314 |
| 2013/0214784 A1 * | 8/2013 | Dietz | G01R 33/3854 | 324/314 |
| 2014/0210468 A1 * | 7/2014 | Xu | G01R 33/28 | 324/309 |
| 2014/0210470 A1 * | 7/2014 | Xu | G01R 33/28 | 324/309 |
| 2014/0285192 A1 * | 9/2014 | Kalechofsky | G01R 33/561 | 324/309 |
| 2014/0358457 A1 * | 12/2014 | Swanson | G01R 21/133 | 702/60 |
| 2014/0361775 A1 * | 12/2014 | Qiu | G01R 33/3664 | 324/309 |
| 2014/0361776 A1 * | 12/2014 | Miyazaki | G01R 33/5605 | 324/322 |
| 2015/0160313 A1 * | 6/2015 | Jesmanowicz | G01R 33/3607 | 324/322 |
| 2015/0260818 A1 * | 9/2015 | Campagna | G01R 33/3621 | 324/309 |
| 2015/0362572 A1 * | 12/2015 | Pirkl | G01R 33/3852 | 324/322 |
| 2016/0036525 A1 * | 2/2016 | Pirkl | G06F 13/4282 | 398/38 |
| 2016/0054413 A1 * | 2/2016 | Demharter | G01R 33/3607 | 324/309 |
| 2017/0148417 A1 * | 5/2017 | Lee | G09G 5/008 | |

FOREIGN PATENT DOCUMENTS

| | | | | |
|---|---|---|---|---|
| DE | 102006052437 A1 * | 5/2008 | ............ | G01R 33/36 |
| DE | 102007056222 A1 * | 5/2009 | ............ | G01R 33/341 |
| DE | 102007056223 A1 * | 5/2009 | ............ | G01R 33/341 |
| DE | 102014211137 A1 * | 12/2015 | ............ | G01R 33/3852 |
| EP | 1193506 A2 * | 4/2002 | ............ | G01R 33/3621 |
| JP | H0471535 A | 3/1992 | | |
| JP | 08126629 A * | 5/1996 | ............ | G01R 33/54 |
| JP | 3128228 B2 * | 1/2001 | | |
| JP | 2002159470 A * | 6/2002 | ............ | G01R 33/3621 |

* cited by examiner

MAGNETIC RESONANCE APPARATUS

BACKGROUND OF THE INVENTION

Field of the Invention

The invention relates to a magnetic resonance apparatus with a computer that is designed to emit, on each of at least one control channel, at least one control signal, generated from a sequence of values to control, via each channel, least one component of the magnetic resonance device.

Description of the Prior Art

For control and measurement tasks in magnetic resonance devices, complex control devices are used, including a computer to provide a user interface and for data management and likewise to carry out offline computing operations, which computer in turn controls a plurality of further intelligent computing units, which include processors, FPGAs or ASICs and carry out application-specific calculations in hard real-time. These further intelligent computing devices are designed as PC plug-in cards or as separate modules.

The further intelligent computing devices are used in particular for timely control of gradient currents and to provide a frequency-determining synthesizer and a frequency-determining oscillator to generate excitation pulses. The further computing devices additionally include processors to process a data stream from analog-digital converters, in particular for processing the magnetic resonance measurement signals.

Control of the gradient currents is achieved inter alia by calculating gradient anchor points for the x-, y- and z-axes, calculating gradient-based compensation methods, such as digital eddy current compensation, and calculating an axis-specific compensation for time-lags in the gradients. The processing of the ADC data stream of the measured values also includes numerous computation-intensive tasks, in particular the frequency conversion of the measured data using NCO (numerically controlled oscillator) output signals, filtering and reducing the sampling rate for the measured data, sorting the ADC data according to measurement channels, and providing the ADC data to the computer.

The combination of requirements for a hard real-time, that is, the requirement for reaction times of the further computing devices, which are shorter than half the sampling interval, preferably for generating distortion-free signals that are clearly further below that level, with the high computation requirements of individual tasks requires computing-intensive and hence very expensive further computing devices. Due to the requirement for real-time, it is not possible to use conventional programmable computers for these tasks, since even when real-time operating systems are used, the hard real-time required is not achieved.

SUMMARY OF THE INVENTION

An object of the invention is to provide a magnetic resonance apparatus in which the complexity of the control components, and therefore the production costs as well, are reduced.

The problem is solved according to the invention by a magnetic resonance apparatus of the basic type described above, but wherein the magnetic resonance apparatus has a buffer device that includes, for each channel, at least one read-out control device and one control buffer memory. A software tool running on the computing device is designed to determine the values as a function of predefined parameters and to write them to the respective control buffer memory. Each read control device is configured to read values from the control buffer memory of its channel using a read clock derived from a clock that is set independently of the computing device, and to supply those values to the respective component. For each control buffer memory, the order in which the values are read corresponds to the order in which they are written.

According to the invention, at least parts of the further intelligent computing devices that are generally used, which perform control and measurement tasks in hard real-time, are replaced by a software tool that is running on a programmable computing device, i.e., on a conventional computer. A real-time-enabled operating system or an operating system that is not real-time-enabled may be installed on the computing device. It is known, however, that commercial PCs and servers increasingly have a number of processors and/or a number of processing cores per processor, and the individual processing cores are becoming increasingly powerful. The computing capacity of modern computing devices is consequently sufficient to carry out control and measurement tasks extensively in a magnetic resonance device using a software tool running on the computing device. The problem inherent therein is that even real-time-enabled operating systems do not allow any hard real-time, in particular do not allow sample-precise emission or acquisition of data with low variances of the sampling interval, on a time scale that is required for operating a magnetic resonance device. For example, if an excitation pulse is calculated and if individual anchor points for the excitation pulse are transmitted with a time lag, the frequency spectrum of the excitation pulse is then distorted. As a result, the correct region of the test subject is not excited, which leads to unusable measurements or at least to measurements that are clearly of impaired quality.

This problem is solved according to the invention by providing a buffer device that includes a control buffer memory per control channel. A control channel is equivalent to a data channel, via which a control signal is transmitted to a component, that is, for example, to a signal line or to a digital bus. The control buffer memory is a First-In-First-Out (FIFO) buffer. With each cycle of the read clock, the read control device in each case reads a value from the control buffer memory and transmits it to the respective component. Consequently, the values stored in the control buffer are transmitted in succession in a predefined time sequence, that is, with the read clock cycle, in order to generate the control signal. The control signal therefore consists primarily of a sequence of individual digital values with a predefined clock cycle. Depending on the type of component that is to be controlled, a subsequent digital-analog conversion is possible here.

The specification of the values is achieved by the software calculating the values as a function of predefined parameters and writing them to the control buffer memory. The predefined parameters can be set by a user, filed for a specific investigation method in a predefined parameter file, specified as part of the software, or suchlike.

The use of the buffer device ensures that the real-time requirements for the computing device are still only equivalent to soft real-time, i.e. it is averaged only over the time that the system has to provide on-time the values that are to be transmitted as a control signal. As explained, modern computing devices are already fast enough to ensure this. The computing device therefore now only has to ensure an adequate fill level of the buffer and the read clock provides a precise time control.

In order to achieve a high measurement quality, the clocking of control and measurement procedures in the magnetic resonance device has to be extremely precise. In order to achieve this, according to the invention, a clock set independently of the computing device is used. This clock can be set, for example, using a quartz oscillator that is maintained at a defined temperature. The clock that is set independently of the computing device can provide a 10 MHz signal, for example, that is, clocking at 100 ns intervals. Providing values to generate control signals at such a high frequency would place very high demands on the computing device and is not necessary for conventional measurement procedures. For example, a clock with a frequency of 100 KHz, that is, with a cycle length of 10 µs, can be used as a read clock. The derivation of the read clock may be achieved, for example, by using a digital counter, the division factor in particular being programmable.

Control buffer memories for controlling gradients, for supplying radiofrequency pulses to excite regions of a test subject, or to provide other control signals, in particular digital switch signals, can be used as control buffer memories. Three separate control buffer memories can be provided for the x-, y- and z-gradients, but it is also possible to use a joint control buffer memory, from which three values are read in each cycle of the read clock and supplied to the respective gradient coils.

The delivery of the control signals to the components can be achieved directly, that is, the component can be supplied directly with the digital values read from the control buffer memory, but indirect delivery is also possible. In particular, the output of at least one of the at least one control signal to the respective component can be achieved via a digital-analog converter and/or an amplifier.

In magnetic resonance apparatuses it is possible for a digital-analog conversion to take place at some distance from the buffer device. In particular, the digital-analog conversion can be achieved via a digital-analog converter assigned to an amplifier. In many applications it is advantageous to provide galvanic isolation between the read control device and the digital-analog converter and/or to facilitate a transmission that cannot be interrupted by the magnetic fields of the magnetic resonance apparatus. Therefore, a transmission device that is configured to transmit the control signal optically can be connected between the read control device and the digital-analog converter. The transmission device can include two electro-optical converters and a transmission path, one or a plurality of glass fibers, for example. The electro-optical converter on the read control device can be designed as a component of the buffer device.

Additionally or alternatively, it is possible for the transmission device to be designed to serialize or to parallelize a data stream. For example, a high frequency data stream provided by the read control device can be distributed to a plurality of transmission lines and collated again on the digital-analog converter. On the other hand, it is also possible for a number of control signals and/or a number of bits of a control signal, which are provided in parallel by the read control device and/or by further read control devices, to be serialized, transmitted in series, and separated again on the digital-analog converter using the transmission device. Transmission by the transmission device can be achieved with any real-time-enabled protocols that do not delay a signal that has been transmitted or do so for a defined time period. In this case, the control signal can be transmitted unchanged, but it is also possible at any time to provide additional checksums or other error correction mechanisms.

In the magnetic resonance apparatus according to the invention, it is not only the calculations for control tasks that are carried out at least partially, preferably in full, by a software tool that is run by the computing device. The software also implements at least parts of the processing of the measured data that is carried out in conventional magnetic resonance devices by separate computing devices, by FPGAs, for example. However, in magnetic resonance apparatuses, a hard real-time is likewise typically required for the acquisition of measured data and the first processing steps. In order to be able to implement these steps in software, it is possible for the magnetic resonance device to include at least one analog-digital converter, where the buffer device includes at least one measurement buffer memory and at least one write control device, which is configured to write digital data provided by at least one of the at least one analog-digital converter to at least one of the at least one measured data buffer memory using a write clock derived from the clock that was set independently of the computing device, the software being designed to read measured values from the measurement buffer memory. In particular, a measurement buffer memory can be assigned in each case to each of the analog-digital converters. The write control device writes digital data provided by the respective analog-digital converter to said memory using the write clock.

Likewise, the measurement buffer memory is preferably a FIFO buffer. However, other forms of read access, block data transfer, or random access to data from the measurement buffer memory, for example, are also possible using the software.

Advantageously, the write clock is identical with the clock in the analog-digital converter. Alternatively, it would also be possible, however, to write the data from a plurality of analog-digital converters to a single measurement buffer memory. In this case the clock in the analog-digital converter can be derived from the write clock by a clock division function, the clocks in the individual analog-digital converters being in particular phase-shifted. For individual measurement tasks, it is also practical to distribute the digital data provided by an analog-digital converter to a plurality of measurement buffer memories. For example, a multiplexing device can be connected upstream of the analog-digital converter, which device supplies various input signals in a time-dependent manner to the analog-digital converter. For this purpose, a converter signal can be derived from the clock that is independent of the computing device, which signal is supplied to the analog-digital converter, and the write clocks for the individual measurement buffer memories can be derived from the converter clock by a clock division function, the write clocks for various measurement buffer memories being phase-shifted. If a multiplexing device is assigned to an analog-digital converter, then the converter clock or a clock derived therefrom can likewise be supplied to said device, in order to synchronize the multiplexing device, the analog-digital converter and the write procedures to the measurement buffer memory.

A received signal from a receiving antenna on the scanner of the magnetic resonance apparatus or a signal derived therefrom can be supplied to at least one of the at least one analog-digital converter. The analog-digital converter thus converts measurement signals from the magnetic resonance apparatus. The receiving antenna can be in particular a local coil or body coil. The signals derived from the signals received by a receiving antenna can be in particular signals that are converted to an intermediate frequency by a frequency conversion or signals such as are derived from the signals received by a plurality of receiving antennas, for example, using a mode matrix.

The scanner of the magnetic resonance apparatus can include at least one coil to generate a magnetic field, a current-measuring device being assigned to the coil to measure the current flowing through the respective coil, the measurement signal from the current measuring device being supplied in each case to one of the at least one analog-digital converter. The software can consequently monitor the currents flowing through the coil for at least one coil.

In particular, the software monitors the time derivative of the gradient currents that are flowing through the respective gradient coils. This is advantageous since rapidly changing gradient currents can lead to nerve stimulation in living test subjects. The software can be designed to calculate repeatedly a time derivative of the measurement signal from the current-measurement device and in the event that a predefined limiting value for the derivative is exceeded by an absolute value of the time derivative, to trigger the emission of a control signal, which switches at least one component of the magnetic resonance device. In particular, at least one amplifier can be switched off. Alternatively or additionally, when a further limiting value is exceeded by a different parameter, which describes the frequency or time derivative of a coil current, a power supply to the relevant coil can be interrupted, for example, by switching an amplifier.

By acquiring the actual values of the coil currents, self-oscillations of control electronics, in particular of an amplifier, software- or hardware errors, or suchlike can be detected and power supply to the relevant coil can be interrupted.

The scanner of the magnetic resonance apparatus can include at least one transmission antenna to radiate excitation pulses, a power-measuring device being assigned in each case to the transmission antenna to monitor the power output that has been radiated, a measurement signal from the power-measuring device being supplied in each case to one of the at least one analog-digital converter. By monitoring the power output in such a way, there is always in particular time-resolved consumption data available, overloading of components can be prevented, and a back-up is available to place the magnetic resonance device in a safe mode if a malfunction of the magnetic resonance device is detected due to monitoring the power output. In particular, the software can be designed to trigger the emission of a control signal, which switches at least one component of the magnetic resonance device in the event that a predefined limiting value for the power is exceeded by the measurement signal from the power-measuring device. For example, at least one amplifier can be switched off.

The software can be designed to determine a periodic sequence of values and to multiply consecutively values read from the measurement buffer memory by consecutive values from the sequence of values in order to convert a received signal from a receiving antenna or a signal derived therefrom to a different frequency. The software calculates the equivalent to an NCO. Due to the use of a buffer device, hard real-time is not required to calculate the anchor points on the oscillator or for the further steps in frequency conversion.

Alternatively, it would be possible to carry out a frequency conversion even before the analog-digital conversion or between the analog-digital conversion and writing to the buffer memory. In particular, the buffer device can include a hard-wired circuit to provide an NCO with a frequency and phase position predefined by the software.

In particular, there occurs a shift in the frequency of the received signals or of the derived signals to a lower frequency. It is therefore possible to map the information from the received signal even with a fairly low number of anchor points, that is, when there is a fairly low sampling rate. In the magnetic resonance device according to the invention, data reduction can be achieved by the values that have been read from the measurement buffer memory being frequency-converted and filtered by the software and then the number of anchor points in the measurement signal depicted by the values being reduced.

The read control device can be designed to read values from two of the control buffer memories with different read clocks, derived in each case from the clock that was set independently of the computing device, and to supply them to the respective component. For example, parts of the control buffer memory having a clock at 10 µs intervals and parts of the control buffer memory having a clock at 100 ns intervals can be read. In particular, a faster clock can be identical to the clock that was set independently of the computing device. In particular, at least one of the at least one control buffer memory that provide/provides trigger signals or a clock to a write control device or to a further read control can be clocked with a higher clock rate.

The buffer device can in particular include at least one control buffer memory for digital values. The control signal assigned to this control buffer memory can be used for digital control tasks, for example, to start and stop clocks for read control devices and/or write control devices, switch duplexers, or switch a detuning circuit for a local or body coil.

The buffer device can include at least one counter, which is designed to increment a clock value by the clock that was set independently of the computing device or by a further clock derived therefrom and when a predefined limiting value is reached, to switch a digital control signal that is supplied to a component of the magnetic resonance device, it being possible for the counter to be reset by the software. Therefore, a "watchdog timer" is implemented, which is able to switch a component of the magnetic resonance device if the counter is not regularly reset by the software. If a plurality of individual software routines are to be monitored, a number of corresponding clocks can also be provided. The switched component can be one or a number of amplifiers, so that, in cases where the counter is not regularly reset, amplifiers are switched off and a safe operating state of the magnetic resonance device is established. Safety-relevant software routines can be monitored using a corresponding counter.

The read control device and/or the write control device can be designed to generate the read clock and/or write clock by a frequency division in the clock set independently of the computing device, it being possible for the division factor for the frequency division to be predefined by the software. In particular, the frequency division can be achieved using a counter. A division factor can be predefined, for example, by its being filed as the first value in a control buffer memory before any triggering of the read control device, that is, before starting to generate the read clock.

The read control device and/or the write control device can be designed to start the read clock and/or the write clock as a function of an external start signal and, on receipt of a start signal, to set a phase of the clock at a value that is predefined by the software. The start signal can be predefined directly by the software, in particular, however, the start signal is emitted by a further read control device from a corresponding read control buffer memory. Accordingly, it is possible to provide a stop facility for the read clock and/or the write clock as a function of a stop signal.

Defining a phase for the clock can be achieved by using a counter for clock division with an initial value for the counter being predefined by the software before counting starts on the clock that was set independently of the computing device. Through the procedure that has been described, time resolutions for start- or stop times for measurement data acquisition and/or an emission of a control signal can be determined with a higher resolution than the cycle duration of the respective write or read clock.

At least one of the at least one component can be a gradient coil and/or a transmission antenna to transmit excitation pulses. The software can also be designed to determine values for the generation of a control signal supplied to the transmission antenna and/or of a control signal supplied to the gradient coil and to write it in each case to a control buffer memory of the buffer device. In particular, in a further control buffer memory, the software can store trigger signals to start data acquisition and/or data output.

A frequency-shifting device for converting the frequency of the control signal can be connected between the read control device and the transmission antenna. The frequency conversion can be achieved, for example, by multiplying the control signal by the signal from an oscillator with a predefined frequency and in particular by subsequent filtering. The oscillator can be provided as an NCO by the buffer device itself or by the software. As a result of the frequency conversion, the control signal can be shifted to higher frequencies. Consequently, the control signal can be generated by a software tool at a lower frequency, which is why a lower time resolution of the control signal is likewise necessary.

The buffer device can be designed in particular as a plug-in card for the computing device.

The computer can include at least two processors and/or at least one of the processors can have multiple of processing cores. The software can be designed to carry out individual program segments in parallel on various processors and/or processing cores. In particular, individual processing cores and/or processors can be used exclusively to calculate and make available values for one or a plurality of control signals and/or for reading and processing data from one or a plurality of measurement buffer memories.

DESCRIPTION OF THE PREFERRED EMBODIMENTS

Figure 1:
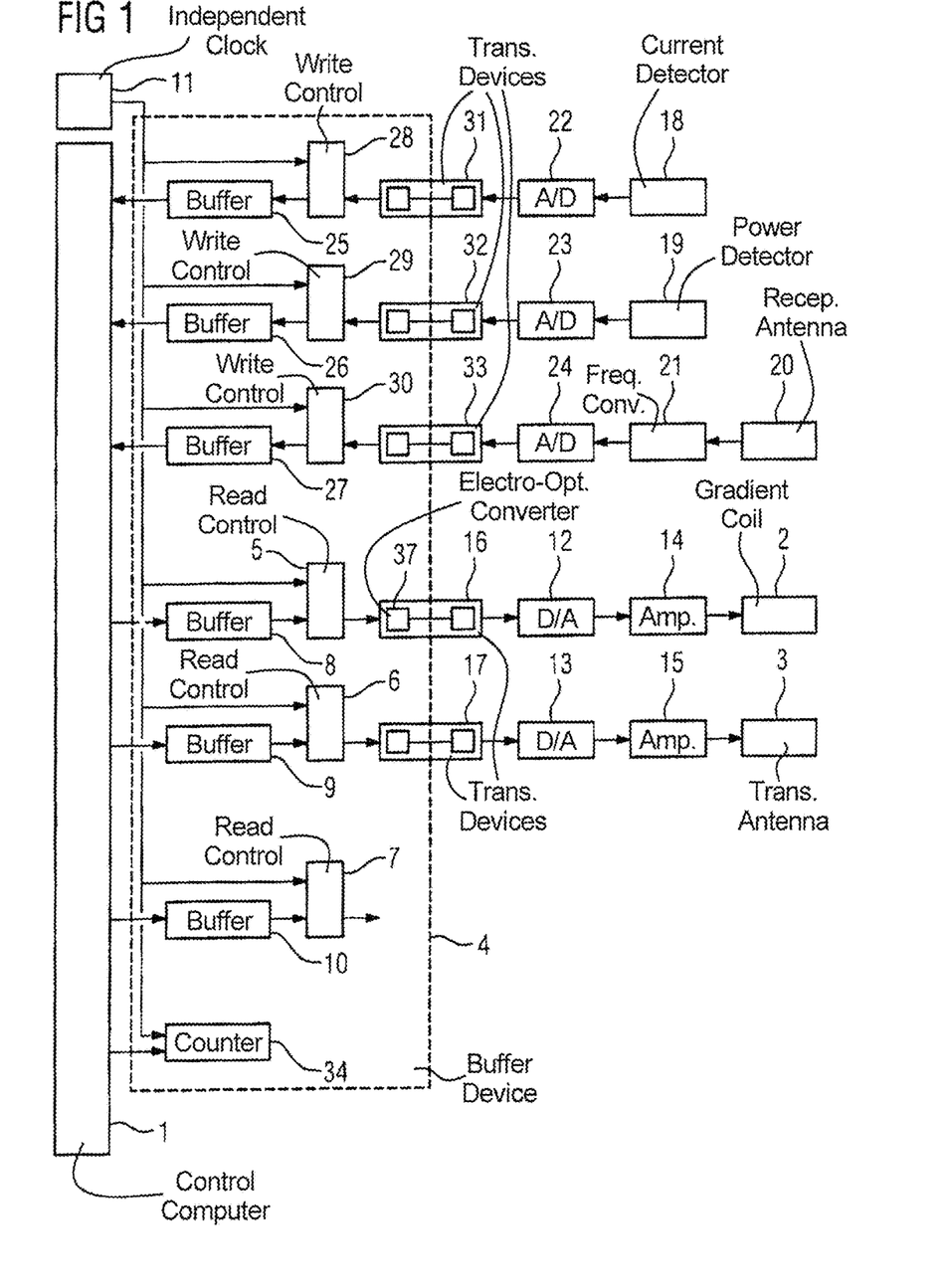
FIG. 1 is a block diagram of the measurement and control components of an embodiment of a magnetic resonance apparatus according to the invention.

FIG. 1 shows in schematic form the measurement and control components of a magnetic resonance apparatus. The magnetic resonance apparatus has a control computer 1, which encompasses multiple processors, each having multiple of processing cores. Using a software tool, which is run on the computer 1, values are provided for generating a control signal to control a number of components 2, 3 of the scanner of the apparatus, namely, the gradient coils and a transmission antenna that transmits excitation pulses to excite nuclear spins in regions of an examination subject. Thereafter, measured data from the magnetic resonance scanner and further monitoring data are acquired and processed by the software. Individual software routines, which serve in each case to acquire and further process certain parts of the acquired data or to make available values for a specific component of the components 2, 3 that are to be controlled, are carried out in each case on a separate processing core.

For clarity, only two components to be controlled 2, 3 are shown in FIG. 1. In particular, only one gradient coil to be controlled, component 2, is shown. Real magnetic resonance devices typically include a number of gradient coils and potentially further controllable components, the control of which is achieved in accordance with the control for the components 2, 3 shown here.

In order to achieve control of the components 2, 3 in hard real-time, that is, with a defined response time and in particular with a defined interval between the output of two values to control the components 2, 3, the magnetic resonance device includes a buffer device 4, which is designed as a plug-in card for the computing device 1. Values from which the control signal is generated are each provided to the component 2, 3 by a read control device 5, 6. In addition to the read control devices 5, 6, a further read control device 7 is shown, which provides digital control signals to various components that are not shown. The read control device 7 transmits, for example, start and stop signals to the read control devices 5, 6, which start or stop an output of a value to generate the respective control signal. With the use of the software that is run on the computing device 1, the control buffer memories (buffers) 8, 9, 10 assigned to the read control devices 5, 6, 7 are filled, and to be precise, filled in the sequence in which the values are subsequently intended to be supplied to the control buffer memory in order to generate the respective control signal.

The output of the values stored in the control buffer memories 8, 9, 10 by the assigned read control device 5, 6, 7 ensues as a function of a clock 11 that is set independently of the computing device. The clock that is set independently of the computing device is provided by a quartz oscillator that is stored at an elevated constant temperature, in order to allow a very high time constancy of the clock 11.

The read control devices 5, 6, 7 each include a counter for clock division in the clock 11 that is set independently of the computing device, which counter provides one read clock in each case. A division factor to generate the read clock and also a phase position, at which the clock starts upon receipt of a start signal, can be provided separately by the software for the read control devices 5, 6, 7. Data delivery is achieved as follows: the division factor and an initial counter value, with which the counter begins to count and consequently the phase position, are written into the respective control buffer 8, 9, 10 by the software as initial values before a data output begins. Upon receipt of a start signal via the respective read control device 5, 6, 7, first these two values are read, the counter is initialized and at the next read clock generated within the read control device, the next value stored in the buffer memory device 8, 9, 10 is output.

Alternatively, it is possible to provide the division factor for the clock division and/or the phase position of the respective read clock via the computer 1 direct to the read control devices 5, 6, 7 or to provide corresponding values via a further control buffer memory.

The components to be controlled 2, 3 are components that are controlled by an analog system. Therefore, the values provided by the read control devices 5, 6 are supplied to digital-analog converters 12, 13, which convert the digital control signal, which consists of a sequence of the values that have been output, into an analog control signal. This signal is supplied to the controlled components 2, 3 via amplifiers 14, 15. Advantageously, the digital-analog converters 12, 13 can be designed as one unit with the respective amplifier 14, 15.

By using a respective transmission device 16 or 17, the read control devices 5, 6 are decoupled galvanically from the digital-analog converters 12, 13 and hence likewise from the components 2, 3. For this purpose, the transmission devices 16, 17 each include two electro-optical converters 37 and also a light conductor, which transmits the control signals that have been converted into optical signals between the electro-optical converters 37. The electro-optical converters 37 on the respective read control device 5, 6 can form one unit with the further components of the buffer device.

Alternatively or additionally, it is possible for the transmission devices 16 to serialize or parallelize for transmission the data provided by one or a number of read control devices 5, 6. If, for example, signals from a plurality of read control devices are to be transmitted to components located close to one another and if the transmission capacity of an individual light conductor is sufficiently high, the data from a number of read control devices 5, 6 can be serialized, transmitted via the light conductor, and separated again on the digital-analog converter. It is also possible to use a number of transmission lines to transmit the data from a read control device.

The buffer device 4 also makes it possible to acquire and evaluate data provided by further components of the magnetic resonance device, using the software running on the computing device 1. The data is provided by a current detection device 18, which measures the current that is actually flowing through a gradient coil, a power-measuring device 19, which measures an output emitted by a transmission antenna to generate an excitation pulse, and also by a receiving antenna 20, that is, a local or body coil of the magnetic resonance device. Only one respective component is shown here in each case, although real magnetic resonance apparatus can in each case have a number of these elements, in particular three current measurement devices 18 and one or more reception antennas 20.

The signals from the receiving antenna 20 are converted by a frequency conversion device 21 to an intermediate frequency before they are sent for further processing. The signals provided are then converted in each case via a analog-digital converter 22, 23, 24 into digital value sequences, which are subsequently transmitted to the buffer device 4 by the transmission devices 31, 32, 33. The transmission devices 31, 32, 33 are designed to correspond with the transmission devices 16 and 17.

To acquire the respective measurement data, the buffer device 4 includes the three measurement buffer memories 25, 26 and 27. The measurement buffer memories 25, 26, 27 are filled by the write control devices 28, 29, 30. Each of the write control devices 28, 29, 30 includes a clock divider to generate a write clock from the clock 11 that was set independently of the computing device. The generation of the write clock is achieved as described for the generation of the read clock for the read control device 5, 6, 7.

In each cycle of the respective write clock, a signal provided in each case by the assigned digital-analog converter 22, 23, 24 is recorded by the write control device 28, 29, 30 in the respective measurement buffer memory 25, 26, 27. Advantageously, the write clock is also used here as a clock for the digital-analog converter. The software can subsequently read the measured values from the respective measurement buffer memories 25, 26, 27.

Due to the use of measurement buffer memories 25, 26, 27 and control buffer memories 8, 9, 10, hard real-time is not required for a number of control and measurement tasks and the corresponding control and measurement tasks can be carried out by the software. In particular, it is possible by using the buffer device 4 to calculate control signals for the gradient coils, including gradient-based compensation methods, such as digital eddy current compensation, and of an axis-specific gradient delay compensation, and also to calculate excitation pulses in software on a programmable computing device 1, which is not designed to provide data in hard real-time. Likewise, a number of data acquisition and processing tasks, as well as a conversion of measured data from a receiving antenna to a lower frequency and a subsequent filtering and data reduction can be carried out by the software without requiring additional separate computing devices. In addition, it is possible at relatively low cost to incorporate further monitoring functions, such as monitoring the actual gradient currents and the transmission output of transmission antennas, into the magnetic resonance device.

In order to ensure high reliability of the magnetic resonance apparatus according to the invention, it is advantageous for the buffer device to additionally include at least one counter 34, which increments a counter value of the clock that was set independently of the computer or of a further clock derived therefrom and, when a predefined limiting value is reached, transmits a control signal that switches off one or a plurality of components of the magnetic resonance device. In particular, the amplifiers 14, 15 can be switched off. The counter 34 can be reset by the software running on the computing device 1. The counter 34 consequently forms a "watchdog timer", which de-activates components of the magnetic resonance device if a reset signal is not received regularly by the software. As a result thereof, in the event that a software tool does not respond for a predefined time interval, the magnetic resonance device is placed into a safe operating mode. For reasons of clarity, only one such counter 34 is shown. Advantageously, the buffer device includes a plurality of counters 34, which each monitor one component of the software.

Figure 2:
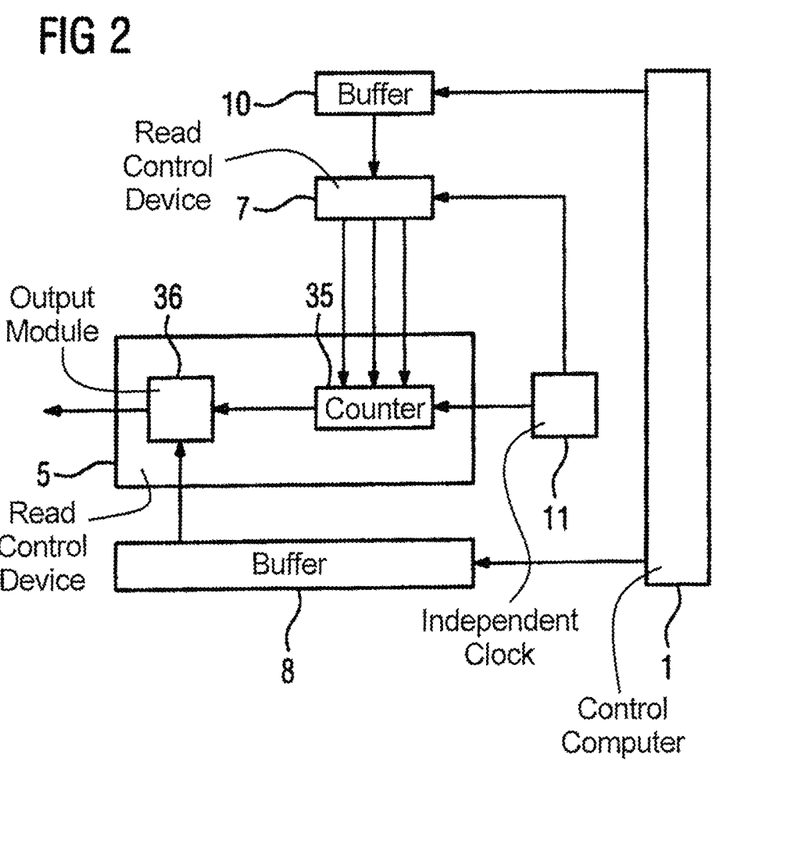
FIG. 2 is a detailed block diagram of individual control components of a further embodiment of a magnetic resonance apparatus according to the invention.

FIG. 2 shows in detail an option for controlling the read control device 5 to provide a control signal for a gradient coil 2. As already explained with respect to FIG. 1, the read control device 5 serves to provide values stored in the control buffer memory 8 to the components 2 in a clocked manner. The control of the read clock is achieved by the further read control device 7 with the assigned further control buffer memory 10, which serves to provide digital control for a number of components.

The read control device 5 includes a counter 35, which generates a read clock from the computer-independent external clock 11. The counter 35 can be configured by the software running on the computing device 1 indirectly via the further control buffer memory 10. The control buffer memory 10 is read by the further read control device 7 using a clock 11 derived from the clock that is independent of the computer. In order to specify a start of the reading of the control buffer memory 8 at a defined point of time using a defined clock divider and a defined phase position, a clock divider value, a phase value and a start signal are written in the further control buffer memory 10 by the software. The further control buffer memory 10 is read in a set clock by the further read control device 7 and as soon as it reaches the point in the control buffer memory where the values described are stored, these values are provided to the counter

35. Consequently a clock divider, that is, a maximum for the counter 35, is set, and then an initial value for the counter is set in order to define a phase in the read cycle, and finally the counter is activated, such that the counter is incremented with each cycle of the clock 11 that is independent of the computer. When the predefined counter value is reached, that is, the clock divider value, the counter is reset in each case and clock signal is sent to the read clock.

The output module 36 of the read control device 5 reads a value from the control buffer memory 8 with each input of a clock signal from the read clock and transmits this value. The output to a gradient coil 2 ensues in particular as shown in FIG. 1 by means of a transmission device 16, a digital-analog converter 12, and an amplifier 14.

Although modifications and changes may be suggested by those skilled in the art, it is the intention of the inventor to embody within the patent warranted hereon all changes and modifications as reasonably and properly come within the scope of his contribution to the art.

I claim as my invention:

1. A magnetic resonance apparatus comprising:
   at least one controlled component that participates in acquisition of magnetic resonance data;
   a control computer, comprising at least one control channel in communication with said at least one controlled component, said control computer being configured to generate a control signal from a sequence of values that controls said at least one controlled component;
   a buffer device connected to each channel of said control computer between said control computer and said controlled component;
   said buffer device comprising a read control device and, for each channel of said control computer, a control buffer memory;
   said control computer being configured to determine said values dependent on predetermined parameters and to write the values into the control buffer memory;
   a clock configured to generate a clock signal independently of said control computer and to supply said clock signal to said read control device;
   said read control device being configured to read the values from the control buffer memory and to supply the values from the read control device to the controlled component using a read clock derived from said clock signal;
   said read control device being configured to read said values from said control buffer memory in an order corresponding to an order in which the values are written into said control buffer memory;
   at least one measurement signal-generating component;
   said control computer comprising at least one measurement signal-receiving channel in communication with said measurement signal-generating component;
   an analog-to-digital converter connected in said measurement signal-receiving channel between said control computer and said measurement signal-generating component;
   said buffer device comprising at least one measurement buffer memory and at least one write control device connected in said at least one measurement signal-receiving channel;
   said at least one write control device being configured to write signal data, corresponding to measured values, provided by said analog-to-digital converter into said at least one measurement buffer memory using a write clock derived from said clock signal; and
   said control computer being configured to read said measured values from said measurement buffer memory.

2. A magnetic resonance apparatus as claimed in claim 1 comprising, for each channel, an intermediate component connected between the respective channel and the controlled component connected thereto, said intermediate device being selected from the group consisting of a digital-to-analog converter and an amplifier.

3. A magnetic resonance apparatus as claimed in claim 1 comprising an optical transmitter/receiver arrangement connected between said read control device and the controlled component, said optical transmitter/receiver arrangement being configured to optically communicate said values from said read control device to said controlled component.

4. A magnetic resonance apparatus as claimed in claim 1 wherein said measurement signal-generating component is a reception antenna that receives said magnetic resonance data.

5. A magnetic resonance apparatus as claimed in claim 4 wherein said control computer is configured to determine a periodic sequence of values and to multiply values consecutively read from said measurement buffer memory by consecutive values from said sequence of values, to convert the signal from said receiving antenna at a first frequency into a signal at a different frequency.

6. A magnetic resonance apparatus as claimed in claim 1 wherein said at least one controlled component is a coil that generates a magnetic field, and wherein said at least one measurement signal-generating unit is a current measurement device that measures a current flowing through said coil.

7. A magnetic resonance apparatus as claimed in claim 6 wherein said control computer is configured to repeatedly calculate a time derivative of said current and to generate a control signal that switches said coil when said time derivative exceeds a predetermined value.

8. A magnetic resonance apparatus as claimed in claim 1 wherein said at least one controlled component is a radio frequency radiator that radiates excitation pulses to cause said magnetic resonance data to be generated, and wherein said at least one measurement signal-generating device is a power measuring device that monitors power emitted by said antenna.

9. A magnetic resonance apparatus as claimed in claim 8 wherein said control computer is configured to repeatedly calculate a time derivative of said power and to emit a control signal that switches said antenna when said derivative exceeds a predetermined value.

10. A magnetic resonance apparatus as claimed in claim 1 wherein said write control device is configured to generate said write clock by frequency division of said clock signal that is independent of said computer device, by a predetermined division factor.

11. A magnetic resonance apparatus as claimed in claim 1 wherein said write control device is configured to start said write clock dependent on an external start signal, and is configured, upon receipt of said start signal, to set a phase of the write clock to a predetermined value.

12. A magnetic resonance apparatus as claimed in claim 1 wherein each read control device is configured to read values from two of said control buffer memories with different read clocks derived from said clock signal, and to supply said values to respectively different controlled components.

13. A magnetic resonance apparatus as claimed in claim 1 wherein said buffer device comprises a counter configured to increment a counter value according to said clock, and, upon said counter value reaching a predetermined limit value, being configured to switch a digital control signal supplied to a respective controlled component, and wherein said control computer is configured, after the switching, to reset said counter.

14. A magnetic resonance apparatus comprising:
at least one controlled component that participates in acquisition of magnetic resonance data;
a control computer, comprising at least one control channel in communication with said at least one controlled component, said control computer being configured to generate a control signal from a sequence of values that controls said at least one controlled component;
a buffer device connected to each channel of said control computer between said control computer and said controlled component;
said buffer device comprising a read control device and, for each channel of said control computer, a control buffer memory;
said control computer being configured to determine said values dependent on predetermined parameters and to write the values into the control buffer memory;
a clock configured to generate a clock signal independently of said control computer and to supply said clock signal to said read control device;
said read control device being configured to read the values from the control buffer memory and to supply the values from the read control device to the controlled component using a read clock derived from said clock signal by frequency division of said clock signal that is independent of said computer device, by a predetermined division factor; and
said read control device being configured to read said values from said control buffer memory in an order corresponding to an order in which the values are written into said control buffer memory.

15. A magnetic resonance apparatus as claimed in claim 1 wherein said read control device is configured to start said read clock dependent on an external start signal, and is configured, upon receipt of said start signal, to set a phase of the read clock to a predetermined value.

16. A magnetic resonance apparatus as claimed in claim 1 wherein said at least one controlled component is selected from the group consisting of a gradient coil and a transmission antenna that transmits radio frequency excitation pulses.

17. A magnetic resonance apparatus as claimed in claim 1 wherein said at least one controlled component is a transmission antenna that transmits excitation pulses, and comprising a frequency-shifter that converts a frequency of said control signal, connected between said read control device and said transmission antenna.

18. A magnetic resonance apparatus as claimed in claim 1 wherein said buffer device is a plug-in card of said control computer.

19. A magnetic resonance apparatus as claimed in claim 1 wherein said control computer comprises a plurality of processor entities, selected from the group consisting of individual processors and processor cores, and wherein said processing entities are collectively configured to execute individual program segments in parallel.

* * * * *